United States Patent
Zhao et al.

(10) Patent No.: US 12,347,693 B2
(45) Date of Patent: Jul. 1, 2025

(54) PLASMA PROCESSING METHOD AND MANUFACTURING METHOD OF SEMICONDUCTOR DEVICE

(71) Applicant: Hitachi High-Tech Corporation, Tokyo (JP)

(72) Inventors: Yu Zhao, Tokyo (JP); Makoto Satake, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/907,824

(22) PCT Filed: Jun. 17, 2021

(86) PCT No.: PCT/JP2021/023097
§ 371 (c)(1),
(2) Date: Aug. 29, 2022

(87) PCT Pub. No.: WO2022/264380
PCT Pub. Date: Dec. 22, 2022

(65) Prior Publication Data
US 2024/0194487 A1   Jun. 13, 2024

(51) Int. Cl.
*H01L 21/306* (2006.01)
*H01J 37/32* (2006.01)
(Continued)

(52) U.S. Cl.
CPC .... *H01L 21/3065* (2013.01); *H01J 37/32449* (2013.01); *H10D 30/014* (2025.01); *H01J 2237/334* (2013.01); *H01J 2237/3387* (2013.01)

(58) Field of Classification Search
CPC ........... H01L 21/3065; H01L 29/66439; H01L 21/3213; H01L 21/8234; H01L 29/423;
(Continued)

(56) References Cited

U.S. PATENT DOCUMENTS

2015/0099368 A1   4/2015   Shen et al.
2015/0294843 A1*  10/2015  Chen ................. H01J 37/32862
                                                              134/1.1
(Continued)

FOREIGN PATENT DOCUMENTS

JP   2007-214390 A   8/2007
JP   2013-225604 A   10/2013
(Continued)

OTHER PUBLICATIONS

Office Action mailed Oct. 6, 2022 in Taiwanese Application No. 111121839.
(Continued)

*Primary Examiner* — Duy Vu N Deo
(74) *Attorney, Agent, or Firm* — Miles & Stockbridge, P.C.

(57) ABSTRACT

The present invention provides a plasma processing technology of applying isotropic dry etching to SiGe that does not allow etching amounts of respective SiGe layers to depend on a depth of a laminated structure in a laminated structure in which Si layers and the SiGe layers are stacked alternately and repeatedly. The present invention provides a plasma processing technology of repeating plasma oxidation using an oxygen (O) element containing gas and plasma etching using a fluorine (F) element and carbon (C) element containing gas in a plasma processing method of isotropically etching respective SiGe layers selectively to respective Si layers in a structure in which the Si layers and the SiGe layers are stacked alternately and repeatedly.

10 Claims, 13 Drawing Sheets

(51) Int. Cl.
*H01L 21/3065* (2006.01)
*H10D 30/01* (2025.01)

(58) Field of Classification Search
CPC . H01L 29/66; H01L 29/775; H01L 21/32137; H01L 21/823412; H01L 29/42392; H01L 29/66742; H01J 37/32449; H01J 2237/334; H01J 2237/3387
USPC .................................................. 438/710–719
See application file for complete search history.

(56) References Cited

U.S. PATENT DOCUMENTS

| | | | | |
|---|---|---|---|---|
| 2015/0372119 | A1* | 12/2015 | Zhang | H01L 21/265 438/268 |
| 2017/0271165 | A1* | 9/2017 | Kal | H01L 21/31116 |
| 2019/0013395 | A1 | 1/2019 | Witters et al. | |
| 2019/0019681 | A1 | 1/2019 | Wong et al. | |
| 2020/0027741 | A1 | 1/2020 | Kal et al. | |
| 2020/0335583 | A1* | 10/2020 | Sun | H01L 29/78696 |
| 2021/0066085 | A1 | 3/2021 | Zhang et al. | |
| 2021/0082710 | A1 | 3/2021 | Takahashi et al. | |
| 2021/0335626 | A1* | 10/2021 | Xue | H01L 21/67109 |

FOREIGN PATENT DOCUMENTS

| | | |
|---|---|---|
| JP | 2015-076459 A | 4/2015 |
| JP | 2018-006405 A | 1/2018 |
| JP | 2019-507505 A | 3/2019 |
| JP | 2021-048244 A | 3/2021 |
| WO | WO2021085158 A1 | 5/2021 |

OTHER PUBLICATIONS

Office Action mailed May 15, 2023 in Korean Application No. 10-2022-7018642.
Search Report mailed Aug. 10, 2021 in International Application No. PCT/JP2021/023097.

* cited by examiner

PLASMA IRRADIATION OXIDATION TIME DEPENDENCE

RADICAL IRRADIATION OXIDATION TIME DEPENDENCE

CFx PLASMA IRRADIATION TIME DEPENDENCE

CFx RADICAL IRRADIATION TIME DEPENDENCE

PLASMA PROCESSING METHOD AND MANUFACTURING METHOD OF SEMICONDUCTOR DEVICE

TECHNICAL FIELD

The present invention relates: to a plasma processing method and a manufacturing method of a GAA-FET (Gate All Around-Field Effect Transistor); and in particular to a plasma processing method effectively applied to selective etching technology of an SiGe layer in a laminated film of Si (silicon) and SiGe (silicon germanium) and a manufacturing method of a semiconductor device that forms a GAA-FET.

BACKGROUND ART

In recent years, a GAA-FET (Gate All Around-Field Effect Transistor) is expected as a logic circuit that operates at high speed with low power consumption. The GAA-FET suppresses subthreshold leakage current that becomes apparent along with miniaturization by arranging a channel as a nanowire and a gate electrode around it. In GAA-FET manufacturing, it is required to isotropically etch respective SiGe layers 103 selectively to respective Si layers 102 in an Si (silicon)/SiGe (silicon germanium) laminated structure as shown in FIG. 1. In the Si/SiGe laminated structure, SiGe layers 103 and Si layers 102 are stacked repeatedly under a mask 101 using a silicon oxide film ($SiO_2$) or a silicon nitride film (SiN) and grooves 104 of predetermined depths are formed beforehand. The film thickness of each of the SiGe layers 103 and Si layers 102 is 20 nm or less, for example. It is required to process respective SiGe layers 103 in the laminated structure with the same etching amount. In a next generation GAA-FET, it is expected that the number of SiGe/Si laminated layers will be increased to three or more in order to improve a degree of integration.

As a method for etching an SiGe layer 103 with a high degree of selectivity to an Si layer 102, a plasma etching technology using a halogen gas such as nitrogen trifluoride ($NF_3$), carbon tetrafluoride ($CF_4$), or chlorine ($Cl_2$) is known. Since the binding energy of Si—Ge (binding energy 297 kJ/mol) is smaller than that of Si—Si (binding energy 310 kJ/mol), SiGe is etched selectively by halogen plasma irradiation.

Patent Literature 1 discloses an etching method by microwave plasma using a fluoride gas. Specifically, it discloses, in a method of etching a heterostructure including an SiGe layer and an Si layer formed over the SiGe layer, a method of selectively applying isotropic etching to the SiGe layer by using only a fluoride gas as the reaction gas with a flow rate of 10 to 800 sccm, a processing pressure of 266 Pa or less, a microwave power of 150 to 400 w, and a processing temperature of 5 to 25° C.

Further, Patent Literature 2 discloses a method of using pulse-modulated plasma in a method of selectively applying isotropic etching to SiGe layers in a structure in which Si layers and the SiGe layers are stacked alternately and repeatedly. Specifically, it discloses a method of isotropically etching SiGe layers selectively to Si layers under the conditions that a nitrogen trifluoride ($NF_3$) gas is used as the etching gas and a duty ratio of pulse modulation is set to 50% or less.

CITATION LIST

Patent Literature

PTL 1: Japanese Patent Application Laid-Open No. 2007-214390
PTL 2: Japanese Patent Application Laid-Open No. 2015-76459

SUMMARY OF INVENTION

Technical Problem

Target and actual processing shapes in the case of applying the prior art shown in Patent Literatures 1 and 2 to an Si/SiGe laminated structure shown in FIG. 1 are shown in FIGS. 2A and 2B, respectively. As shown in FIG. 2A, it is required that the etching amounts 204 of respective SiGe layers 203 are identical with respect to Si layers 202 in the target shape. The etching amount 204 of each SiGe layer 203 is 5 to 20 nm. In the actual processing shape, however, as shown in FIG. 2B, the etching amount 204 of each SiGe layer 203 reduces toward the depth direction of the laminated structure ($204a > 204b > 204c$). This depth dependence is thought to be due to the decrease of an etchant in the depth direction. In the next generation GAA-FET, this tendency becomes even more pronounced as the number of stacks increases and a problem is that the electrical characteristics of respective SiGe layers 203 are not aligned. An SiGe selective etching technology of uniformly aligning the etching amounts 204 of respective SiGe layers 203 in the depth direction of a laminated structure (or in the depth direction of a groove) therefore is required.

An object of the present invention is to provide a plasma processing technology of applying isotropic dry etching of SiGe that does not allow an etching amount to depend on the depth of a laminated structure in order to solve the problem in that the etching amounts 204 of respective SiGe layers are not uniformly aligned in the depth direction of the laminated structure.

Solution to Problem

A brief description of a representative of the present invention will be given as follows.

A plasma processing technology of repeating plasma oxidation using an oxygen (O) element containing gas and plasma etching using a fluorine (F) element and carbon (C) element containing gas in a plasma processing technology of isotropically etching respective SiGe layers selectively to respective Si layers in a laminated structure in which the Si layers and the SiGe layers are stacked alternately and repeatedly is provided.

Other problems and novel features will be obvious from the descriptions and attached drawings of the present description.

Advantageous Effects of Invention

The plasma processing technology described above can make the etching amounts of respective SiGe layers in an Si/SiGe laminated structure uniform or identical in the depth direction of the laminated structure in SiGe selective etching for GAA-FET processing.

DESCRIPTION OF EMBODIMENTS

Examples are explained hereunder in reference to the drawings. In the following explanations, however, the same components are designated by the same reference signs and repetitive explanations may sometimes be omitted. Incidentally, a drawing may sometimes be represented schematically in comparison with an actual embodiment in order to clarify an explanation, but is just an example, and does not limit the interpretation of the present invention.

Example 1

Figure 1:
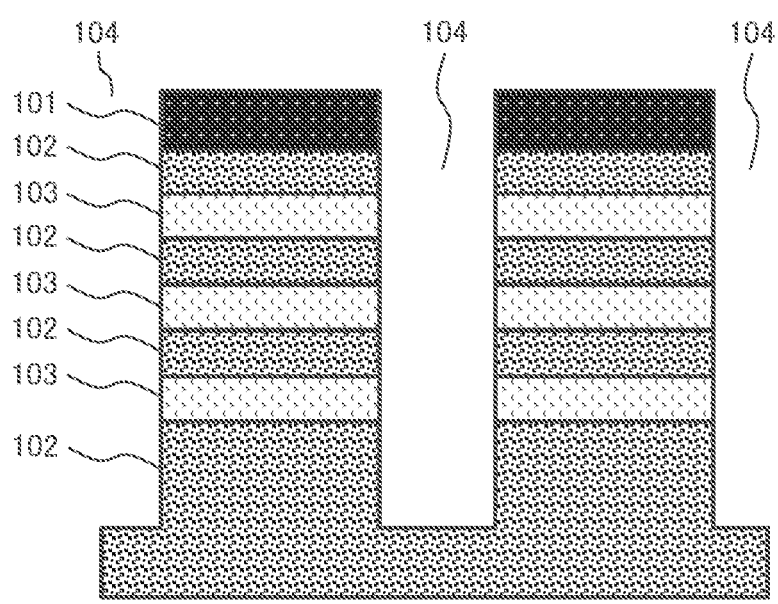
FIG. 1 is a cross-sectional view of an Si/SiGe laminated structure used for manufacturing a GAA-FET.
Figure 2A:
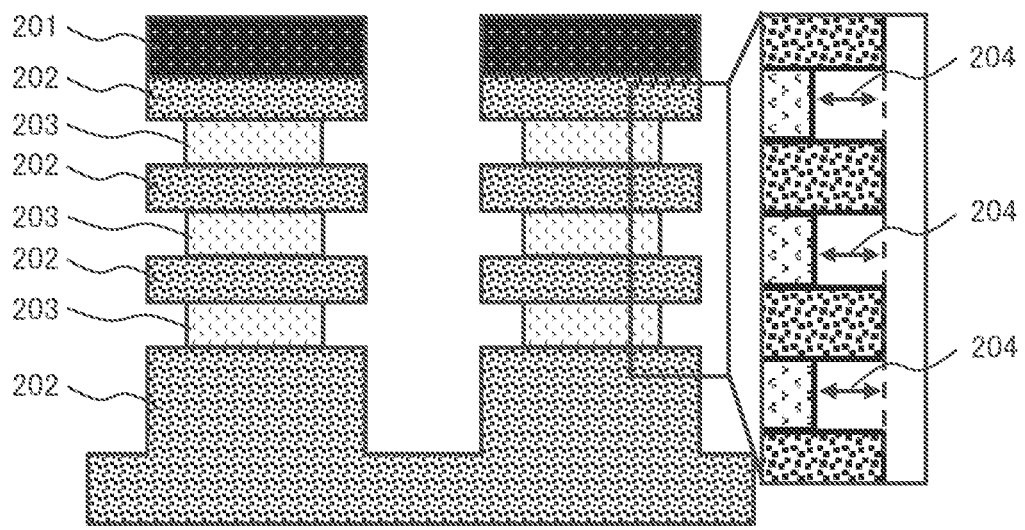
FIG. 2A is a target shape of an Si/SiGe laminated structure in SiGe isotropic etching.
Figure 2B:
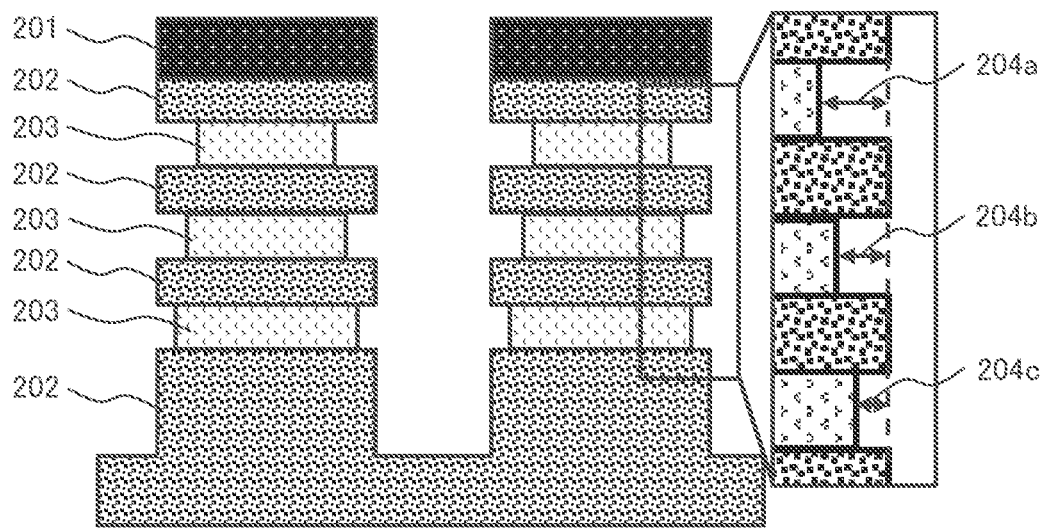
FIG. 2B is an actual processing shape of an Si/SiGe laminated structure in SiGe isotropic etching.
Figure 3:
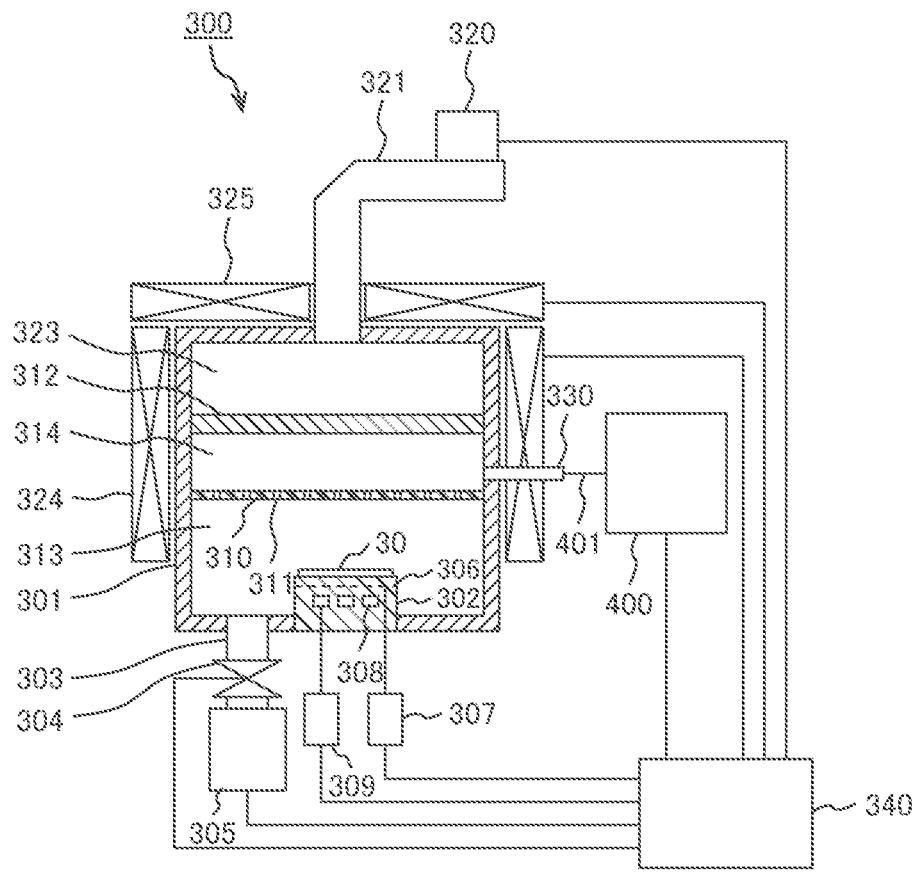
FIG. 3 is a schematic cross-sectional view showing a schematic configuration of a plasma etching apparatus for practicing processing according to Example 1.
Figure 4:
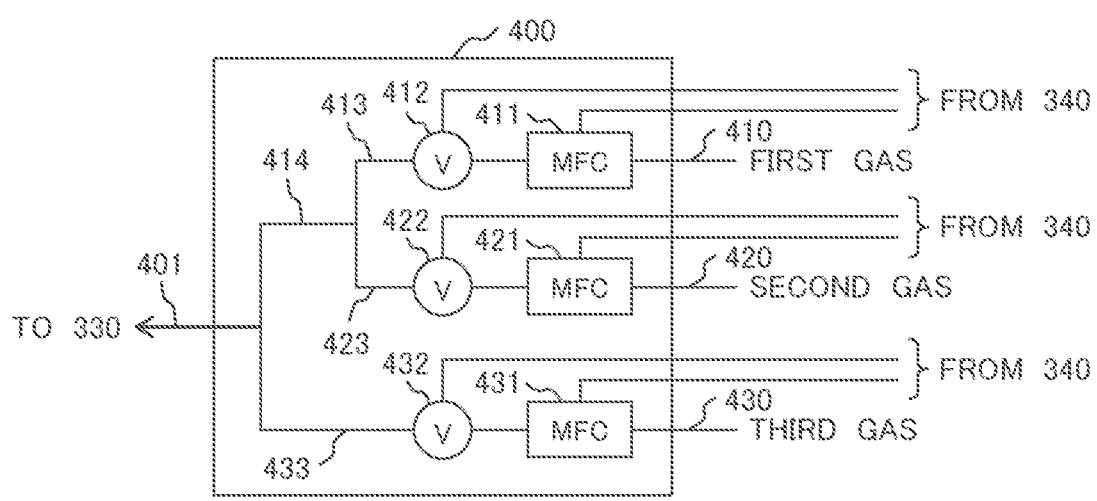
FIG. 4 is a block diagram showing a schematic configuration of a gas supply system in a plasma etching device for practicing processing according to Example 1.

A configuration of a plasma etching apparatus 300 used in the present example is explained in reference to FIGS. 3 and 4.

The plasma etching apparatus 300 has a vacuum chamber 301 that creates a vacuum inside. The vacuum chamber 301 has a substrate mounting table 302 to mount a substrate 30 to be processed inside. Further, a communicating exhaust pipe 303, a vacuum valve 304, and a vacuum pump 305 are attached to the vacuum chamber 301.

A heater 306 and a refrigerant flow path 308 are incorporated in the interior of the substrate mounting table 302. The heater 306 is connected to a power source 307 for heating. The refrigerant flow path 308 is connected to a refrigerant supply unit 309.

A perforated plate 310 in which many small holes 311 are formed and a dielectric window 312 are attached to the interior of the vacuum chamber 301. A decompression chamber lower area 313 is formed under the perforated plate 310 and a decompression chamber upper area 314 is formed between the perforated plate 310 and the dielectric window 312. The space between the dielectric window 312 and the vacuum chamber 301 is sealed in vacuum and the decompression chamber lower area 313 and the decompression chamber upper area 314 in the interior of the vacuum chamber 301 are exhausted in vacuum by the vacuum pump 305.

320 is a magnetron to generate microwaves with a frequency of 2.45 GHz, 321 is a waveguide, and 323 is a cavity to introduce the microwaves. The top surface of the cavity 323 is covered with an electromagnetic coil 325. The side surface of the cavity 323, the side surface of the decompression chamber lower area 313, and the side surface of the decompression chamber upper area 314 are surrounded with an electromagnetic coil 324.

A gas supply nozzle 330 is connected to the decompression chamber upper area 314 and a processing gas with an adjusted flow rate is supplied from a gas supply unit 400 the detailed configuration of which is shown in FIG. 4 to the decompression chamber upper area 314.

The respective operations of the vacuum valve 304, the vacuum pump 305, the power source 307 for heating, the refrigerant supply unit 309, the magnetron 320, the electromagnetic coil 324, the electromagnetic coil 325, and the gas supply unit 400 are controlled by a control unit 340 on the basis of a preset program.

The gas supply unit 400 has such a configuration as shown in FIG. 4. That is, with respect to a first gas supplied from a first gas supply source through a pipe 410, the flow rate of the first gas is adjusted by a mass flow controller (MFC) 411, the flow of the first gas is turned on or off by the opening or closing of a valve 412, and the first gas is supplied to the decompression chamber upper area 314 from the gas supply nozzle 330 through pipes 413, 414, and 401.

Likewise, with respect to a second gas supplied from a second gas supply source through a pipe 420, the flow rate of the second gas is adjusted by a mass flow controller (MFC) 421, the flow of the second gas is turned on or off by the opening or closing of a valve 422, and the second gas is supplied to the decompression chamber upper area 314 from the gas supply nozzle 330 through pipes 423, 414, and 401. The pipes 414 and 401 are shared with the first gas.

Further, with respect to a third gas supplied from a third gas supply source through a pipe 430, the flow rate of the third gas is adjusted by a mass flow controller (MFC) 431, the flow of the third gas is turned on or off by the opening or closing of a valve 432, and the third gas is supplied to the decompression chamber upper area 314 from the gas supply nozzle 330 through a pipe 433 and further the pipe 401 that is commonly shared with the first gas and the second gas.

Incidentally, the MFCs 411, 421, and 431 are connected to the control unit 340, respectively, and the flow rates of the gases flowing in them are controlled by the control unit 340, respectively. Further, the valves 412, 422, and 432 are also connected to the control unit 340, respectively, the openings and closings of the valves 412, 422, and 432 are controlled by the control unit 340, and the flows of the gases flowing in the respective valves are controlled by being turned on or off.

In the above configuration, the vacuum pump 305 is operated in the state of opening the vacuum valve 304 by the control of the control unit 340, a gas is supplied from the gas supply unit 400 through the gas supply nozzle 330 in the state of exhausting the decompression chamber lower area 313 and the decompression chamber upper area 314 in the interior of the vacuum chamber 301 to vacuum, and the decompression chamber lower area 313 and the decompression chamber upper area 314 are set to desired pressures.

In this state, the control unit 340 controls the electromagnetic coils 324 and 325 and a magnetic field of a desired strength is formed in the interior of the decompression chamber upper area 314 of the vacuum chamber 301. Successively, the magnetron 320 generates microwaves by the control of the control unit 340 and the microwaves are supplied to the decompression chamber upper area 314 and the decompression chamber lower area 313 through the waveguide 321.

Incidentally, the magnetic field formed by the electromagnetic coils 324 and 325 is set so that the microwaves of 2.45 GHz supplied to the decompression chamber lower area 313 and the decompression chamber upper area 314 may be strong enough to meet an ECR (Electron Cyclotron Resonance) condition. High-density plasma is generated in the region where a magnetic field of a desired strength is formed.

When plasma is generated in the decompression chamber upper area 314, the small holes 311 formed in the perforated plate 310 have hole diameters that do not allow high-density plasma generated in the decompression chamber upper area 314 to pass through. Ions and some radicals in the high-density plasma generated in the decompression chamber upper area 314 therefore cannot reach the substrate 30 to be processed. Only some of the radicals move toward the side of the decompression chamber lower area 313 and can reach the substrate 30 to be processed. The process of generating plasma in the decompression chamber upper area 314 is described as radical irradiation in the present description since only some of the radicals reach the substrate 30 to be processed in this process.

In contrast, when plasma is generated in the decompression chamber lower area 313, ions and radicals in generated high-density plasma can reach the substrate 30 to be processed. The process of generating plasma in the decompression chamber lower area 313 is described as plasma irradiation in the present description.

In the present example, such etching processing as explained below is applied by using a plasma etching apparatus 300 having such a configuration as explained above.

In Example 1, a plasma processing method of selectively etching SiGe by repeating plasma irradiation using an oxygen ($O_2$) gas (also referred to as plasma oxidation) and radical irradiation (also referred to as CFx radical irradiation or plasma etching) of fluorocarbon radicals (referred to as CFx radicals) using a mixed gas of octafluorocyclobutane ($C_4F_8$) and nitrogen trifluoride ($NF_3$) is adopted. FIGS. 5A to 5F are cross-sectional views of an Si/SiGe laminated structure showing an SiGe selective etching means of Example 1. A process flow of the plasma processing method of Example 1 is shown in FIG. 6.

As explained earlier, a GAA-FET (Gate All Around-Field Effect Transistor) is expected as a logic circuit that operates at high speed with low power consumption. The GAA-FET suppresses subthreshold leakage current that becomes apparent along with miniaturization by arranging a channel region including Si layers as a nanowire and a gate electrode around it. In GAA=FET manufacturing, in the laminated structure (referred to as Si/SiGe laminate structure) of Si (silicon) layers 502 and SiGe (silicon germanium) layers 503 shown in FIGS. 5A to 5F, respective SiGe layers 503 are isotropically etched selectively to respective Si layers 502. In FIGS. 5A to 5F, the lowermost Si layer 502 represents a silicon layer of a semiconductor substrate and each of the multiple Si layers 502 other than the lowermost Si layer 502 can constitute a channel region of the GAA-FET. In the Si/SiGe laminated structure, the SiGe layers 503 and the Si layers 502 are repeatedly stacked under a mask 501 that uses a silicon oxide film ($SiO_2$), a silicon nitride film (SiN), or the like and grooves 510 of a predetermined depth are formed beforehand. The film thickness of each of the SiGe layers 503 and the Si layers 502 is 20 nm or lower, for example. The respective SiGe layers 503 in the Si/SiGe laminated structure are processed with the same etching amount. In a next generation GAA-FET, the number of the SiGe layers is three or more in order to improve a degree of integration.

A plasma processing method for a means of selectively etching SiGe layers 503 is explained hereunder in reference to FIGS. 5A to 5F and FIG. 6.

Figure 5A:
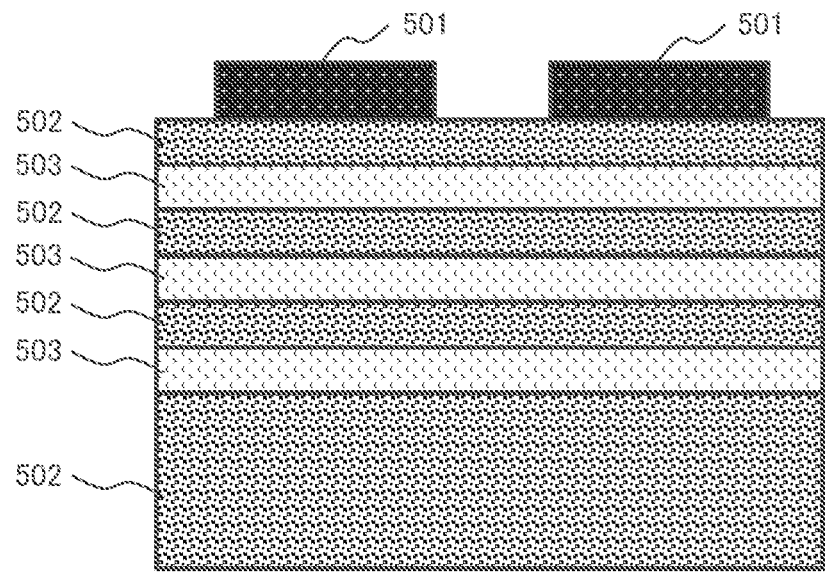
FIG. 5A is a cross-sectional view of an Si/SiGe laminated structure showing a process flow in Example 1.
Figure 6:
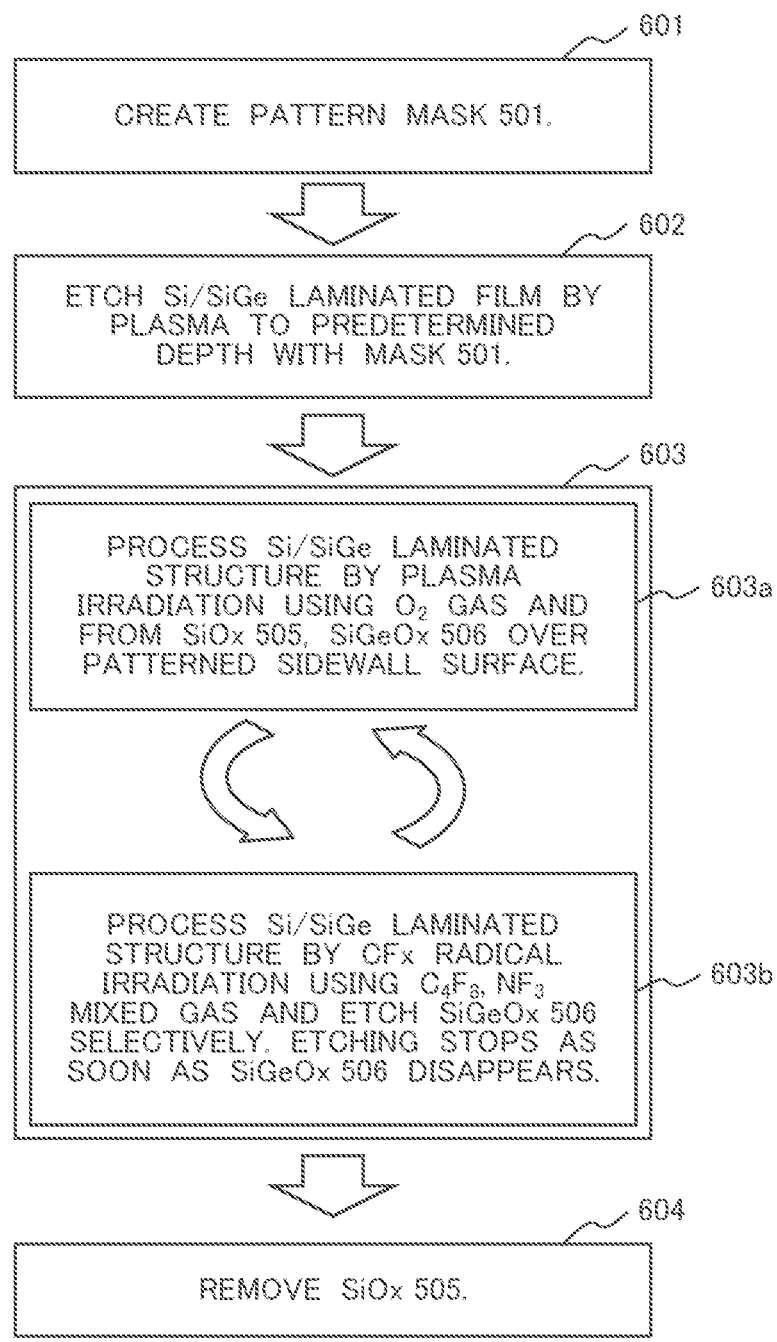
FIG. 6 is a flowchart of an SiGe isotropic etching method in Example 1.

Firstly, a thin film structure to be etched in Example 1 is shown in FIG. 5A (corresponding to Step 601 in FIG. 6). In the structure, Si layers 502 and SiGe layers 503 are stacked alternately under a mask 501 for etching. As the mask 501, a material such as a silicon oxide film ($SiO_2$) or a silicon nitride film (SiN) that can obtain a higher etching selectivity than Si and SiGe is used and the mask 501 is pre-patterned to a desired pattern. Each of the Si layers 502 and each of the SiGe layers 503 are layers including crystal Si and crystal SiGe that are formed by an epitaxial growth method, respectively. The total number of stacks of the Si layers 502 and the SiGe layers 503 is two or more in this example.

Incidentally, the structure etched in Example 1 is not limited to the thin film structure shown in FIG. 5A and may have at least a laminated structure containing two or more kinds of Si, Ge (germanium), and SiGe alloy.

Figure 5B:
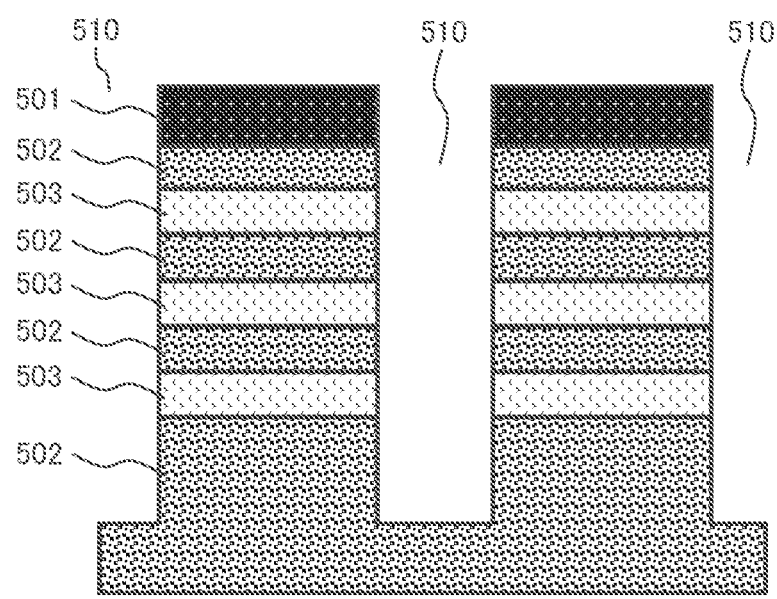
FIG. 5B is a cross-sectional view of an Si/SiGe laminated structure showing a process flow in Example 1.

Successively, at Step 602, grooves 510 of a predetermined depth are formed by plasma etching in the Si/SiGe laminated structure as shown in FIG. 5B by using the mask 501 as a mask of the plasma etching.

Figure 5C:
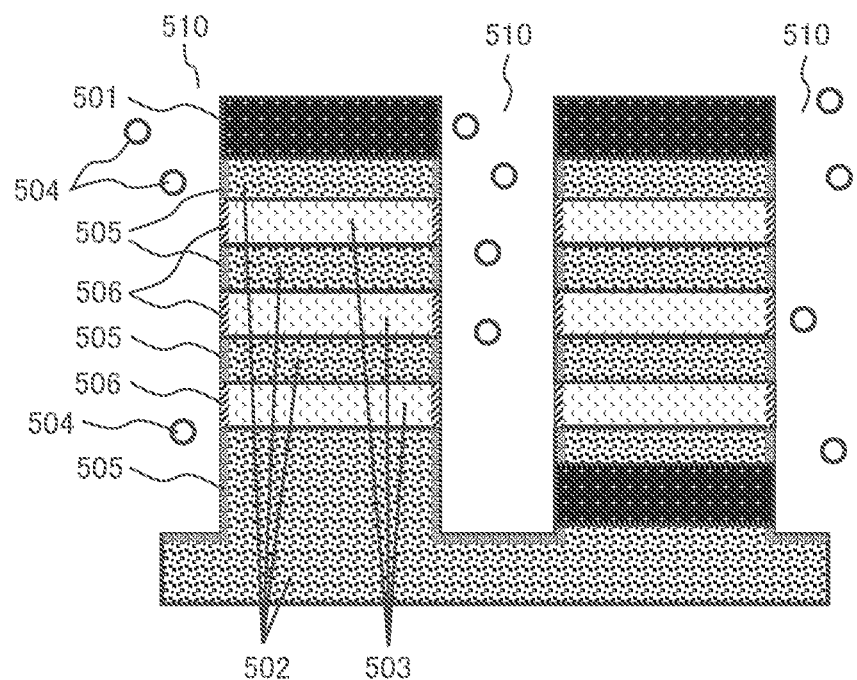
FIG. 5C is a cross-sectional view of an Si/SiGe laminated structure showing a process flow in Example 1.
Figure 5D:
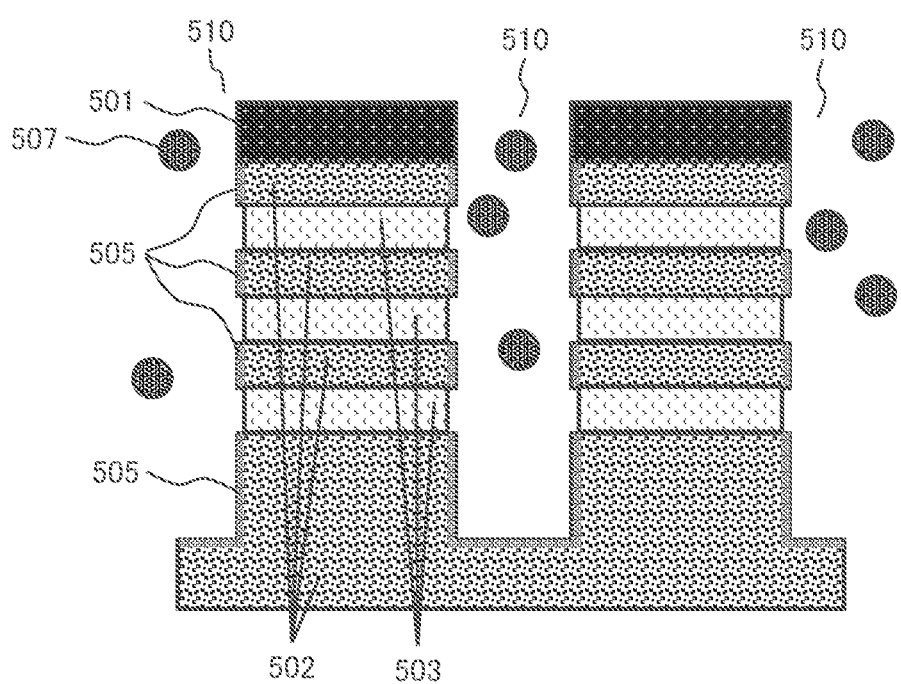
FIG. 5D is a cross-sectional view of an Si/SiGe laminated structure showing a process flow in Example 1.

Successively, at Step 603, Step 603a that is an oxidation process of forming a surface oxide layer by oxidizing the sidewall surface of the Si/SiGe laminated structure and Step 603b that is a removal process of removing the surface oxide layer are repeated as shown in FIGS. 5C and 5D.

Figure 7:
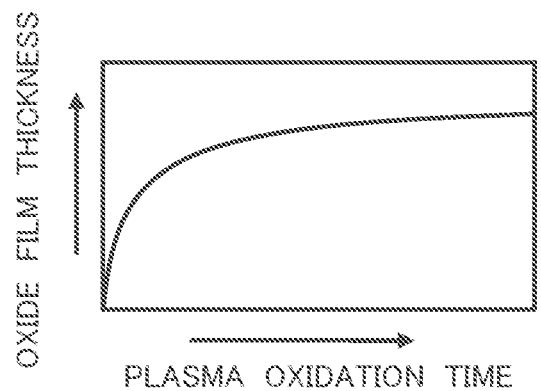
FIG. 7 shows plasma oxidation time dependence of an Si surface oxide film thickness in Example 1.

At Step 603a (oxidation process), silicon oxide layers (hereunder referred to as SiOx layers) 505 and silicon germanium oxide layers (hereunder referred to as SiGeOx layers) 506 are formed over the sidewall surface of the Si/SiGe laminated structure by oxidizing the sidewall surface of the Si/SiGe laminated structure by oxygen plasma 504 using an oxygen element containing gas such as an oxygen ($O_2$) gas as shown in FIG. 5C. That is, at Step 603a, SiOx layers 505 are formed as surface oxide layers over the surfaces of the Si layers 502 and SiGeOx layers 506 are formed as surface oxide layers over the surfaces of the SiGe layers 503 by plasma oxidation by oxygen plasma 504. The oxygen plasma 504 is generated in the decompression chamber lower area 313. FIG. 7 shows oxidation time dependence of the thickness of a surface oxide film (SiOx layer 505) of Si. An Si surface oxide film becomes thicker as an oxidation time increases. The thickness tends to be saturated with the increase of oxidation time. Since SiGe has an almost similar crystal structure as Si, the thickness of an SiGe oxide film (SiGeOx layer 506) also tends to be saturated with the increase of oxidation time similarly to FIG. 7. At Step 603a, an oxidation time that saturates the thickness of an SiGeOx layer 506 is used and hence, at the SiGe layers 503, the SiGeOx layers 506 of the same thickness are formed over the surfaces of the SiGe layers 503.

At Step 603b (removal process), the SiGeOx layers 506 are removed by radical irradiation using a mixed gas of octafluorocyclobutane ($C_4F_8$) and nitrogen trifluoride ($NF_3$) as shown in FIG. 5D. The plasma is generated in the decompression chamber upper area 314. That is, at Step 603b (removal process), the SiGe layers 503 are removed by removing the SiGeOx layers 506 by radicals generated by plasma using a gas containing fluorine elements and carbon elements (a mixed gas of octafluorocyclobutane ($C_4F_8$) and nitrogen trifluoride ($NF_3$)). In the radical irradiation using a mixed gas of $C_4F_8$ and $NF_3$, an etchant that reaches a substrate 30 to be processed is CFx radicals (in other words, CFx radical irradiation is applied to a substrate 30 to be processed). The SiGeOx layers 506 are removed by reacting with CFx radicals and generating silicon tetrafluoride ($SiF_4$), germanium tetrafluoride ($GeF_4$), and carbon monoxide (CO). Since the binding energy of Si—O bond (binding energy: 779.6 kJ/mol) is higher than Ge—O bond (binding energy: 657.5 kJ/mol), the SiOx layers 505 hardly react with CFx radicals and hence remain. Further, when the SiGeOx layers 506 are removed and SiGe over the surfaces of the SiGe layers 503 is exposed, the CFx radicals are deposited over the surface of SiGe. As a result of CFx radical deposition, the etching of the SiGe layers 503 stops. That is, the etching of the SiGe layers 503 stops (here, it is called etch stop). As the processing time at Step 603b, the processing time when the SiGeOx layers 506 are removed and SiGe is exposed is used. Since the thicknesses of the SiGeOx layers 506 formed over the surfaces (side surfaces) of the SiGe layers 503 at Step 603a are the same, the etching amounts of the SiGe layers 503 at Step 603b are the same. In other words, the etching amounts of the SiGe layers 503 can be uniform in the depth direction of the laminated structure (or in the depth direction of the grooves 510).

Figure 5E:
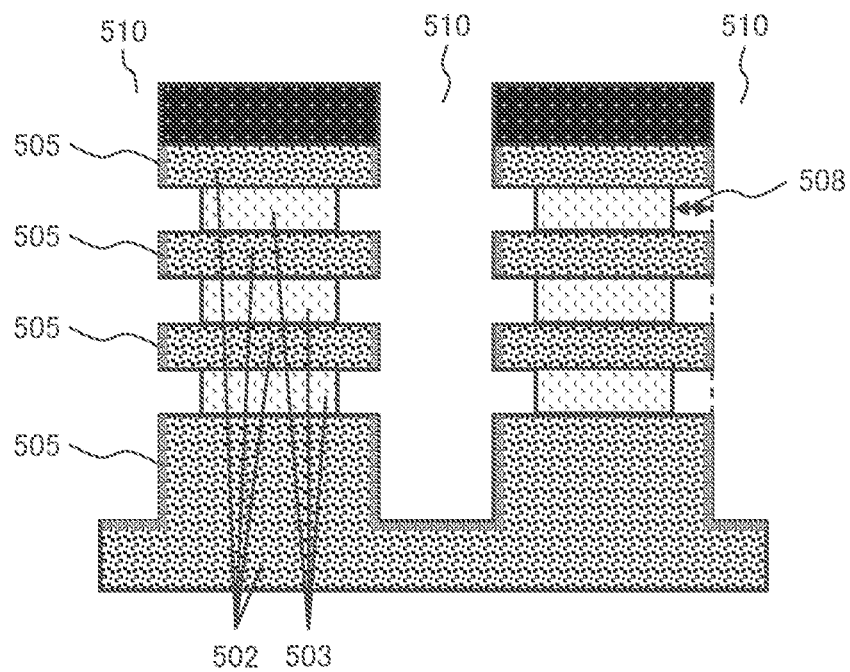
FIG. 5E is a cross-sectional view of an Si/SiGe laminated structure showing a process flow in Example 1.
Figure 5F:
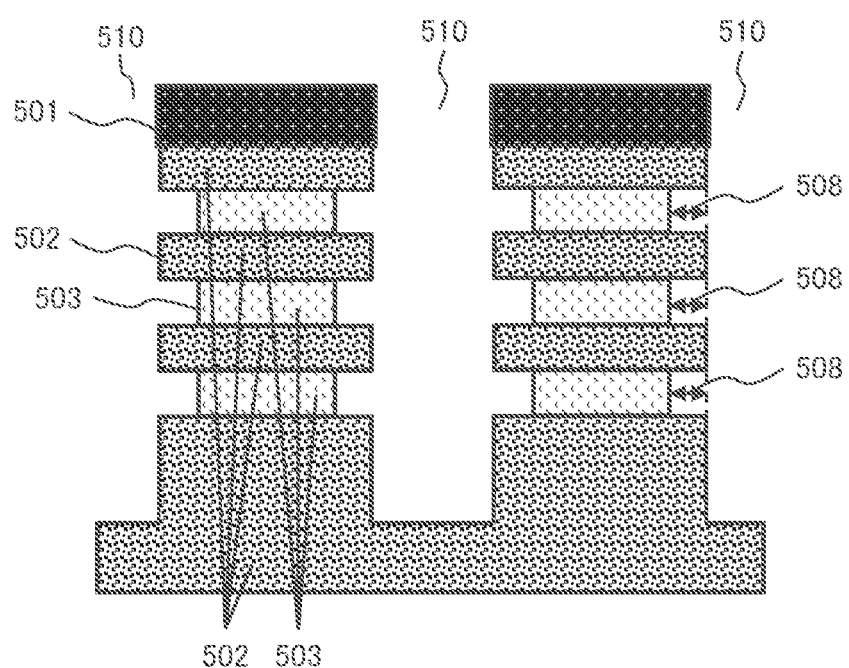
FIG. 5F is a cross-sectional view of an Si/SiGe laminated structure showing a process flow in Example 1.
Figure 8:
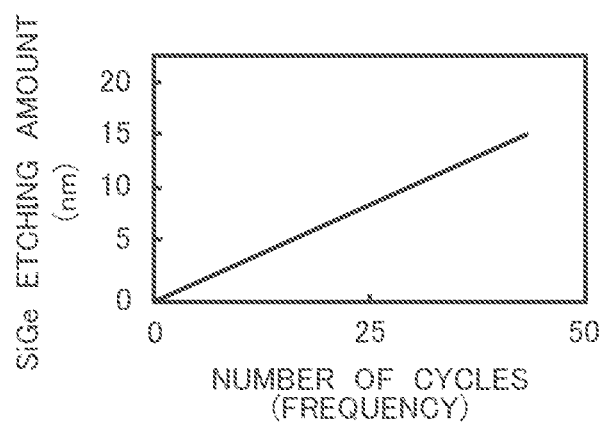
FIG. 8 shows cycle number dependence of an SiGe etching amount in Example 1.

As shown in FIG. 5E, when Steps 603a and 603b are repeated, the etching of the SiGe layers 503 progresses by forming and removing the SiGeOx layers 506. The Si layers 502 remain over the surfaces (side surfaces) of the Si layers 502 because the SiOx layers 505 are not etched. At Steps 603a and 603b, since conditions where the SiGe etching amount is saturated are used, the etching amounts 508 of the SiGe layers 503 can be aligned uniformly in the depth direction of the laminated structure (or in the depth direction of the grooves 510). FIG. 8 shows dependence between an SiGe etching amount and a number of repeated cycles. The SiGe etching amount increases in proportion to the increase of the number of cycles. Here, a number of cycles means a number of repeated cycles when the case where Steps 603a and 603b are performed once is defined as one cycle.

At the last Step 604, the SiOx layers 505 remaining over the surfaces of the Si layers 502 are removed. As means for removing the SiOx layers 505, wet processing and dry etching are known and the SiOx layers 505 can be removed by using the wet processing or the dry etching. The thicknesses of the SiOx layers 505 are a few angstroms, for example.

The plasma processing conditions used at Steps 603a and 603b are explained hereunder.

Figure 9A:
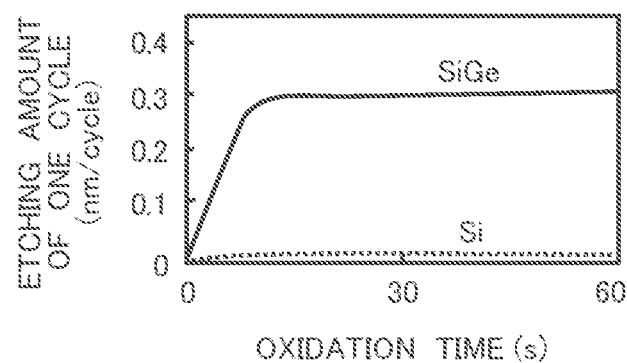
FIG. 9A shows plasma irradiation oxidation time dependence of an SiGe etching speed in Example 1.
Figure 9B:
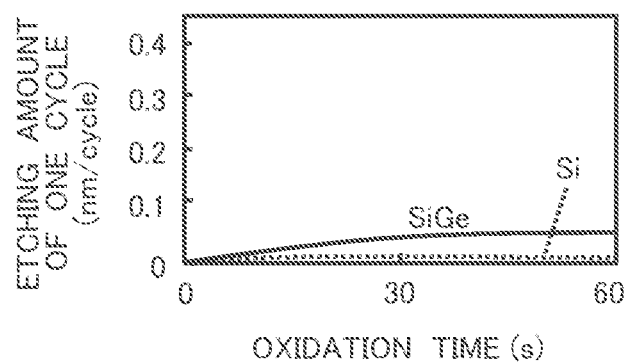
FIG. 9B shows radical irradiation oxidation time dependence of an SiGe etching speed in Example 1.

At Step 603a, oxygen plasma irradiation generated in the decompression chamber lower area 313 is used. FIGS. 9A and 9B show plasma irradiation oxidation time dependence and radical irradiation oxidation time dependence of an SiGe etching speed, respectively. In FIGS. 9A and 9B, the etching amounts of SiGe are represented by the solid lines and the etching amounts of Si are represented by the dotted lines. When oxidation of plasma irradiation is used, as shown in FIG. 9A, the etching amount of SiGe increases with the increase of the oxidation time and becomes nearly constant. This is thought to be due to the saturation of the thickness of an SiGe oxide film. On the other hand, when oxidation of radical irradiation of oxygen (O) radicals is used, as shown in FIG. 9B, the etching amount of SiGe is smaller than the case of the plasma irradiation (refer to FIG. 9A). Further, the oxidation time until the thickness of an SiGe oxide film becomes saturated is longer than the case of the plasma irradiation (refer to FIG. 9A). This is because the radical density of the oxygen (O) radicals that reach a substrate 30 to be processed is smaller in the case of the radical irradiation of FIG. 9B than in the case of the plasma irradiation of FIG. 9A. That is, at Step 603a, radical irradiation may be used but it is more desirable to use the oxidation of plasma irradiation from the viewpoint of improving a throughput.

Incidentally, at Step 603a, it is only necessary to be able to oxidize Si and SiGe with not only oxygen but also a gas containing oxygen.

Figure 10A:
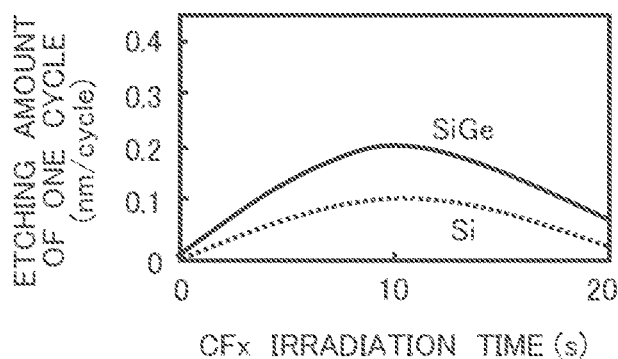
FIG. 10A shows CFx plasma irradiation time dependence of an SiGe etching speed in Example 1.
Figure 10B:
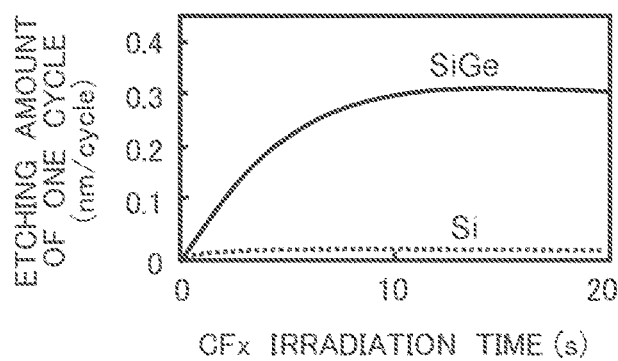
FIG. 10B shows CFx radical irradiation time dependence of an SiGe etching speed in Example 1.

At Step 603b, the radical irradiation in which plasma is generated in the decompression chamber upper area 314 is used. FIGS. 10A and 10B show CFx plasma irradiation time dependence and CFx radical irradiation oxidation time dependence of an SiGe etching speed, respectively. In FIGS. 10A and 10B, the etching amounts of SiGe are represented by the solid lines and the etching amounts of Si are represented by the dotted lines. When the plasma irradiation of CFx plasma is used, as shown in FIG. 10A, the etching amount of SiGe increases with the increase of the irradiation time. Si is etched at the same time, however, and the selectivity between SiGe and Si lowers. This is because ions of plasma reach a substrate 30 to be processed and the reaction between CFx radicals and the SiOx layers 505 is promoted in the CFx plasma irradiation. On the other hand, when radical irradiation of CFx radicals is used, as shown in FIG. 10B, the etching amount of SiGe increases with the increase of the irradiation time and becomes saturated. Si is scarcely etched. That is, the selective etching of SiGe is possible even by using plasma irradiation at Step 603b but it is more desirable to use radical irradiation of CFx radicals at Step 603b from the viewpoint of improving a selectivity.

Figure 11:
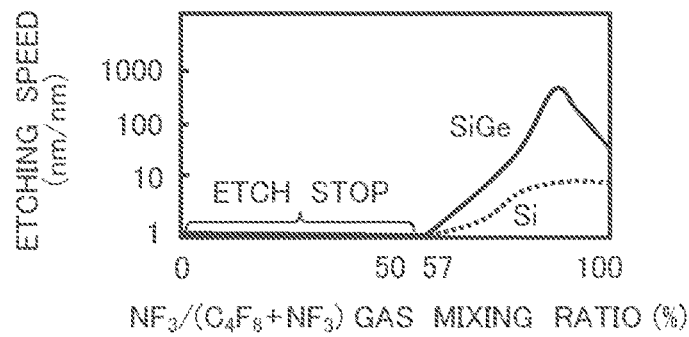
FIG. 11 shows dependence of etching speeds of SiGe and Si on a content of $NF_3$ in a $C_4F_6/NF_3$ mixed gas.

Incidentally, at Step 603b, a mixed gas of $C_4F_8$ and $NF_3$ having an $NF_3/(C_4F_8+NF_3)$ mixing ratio of 57% or less is used. When the $NF_3/(C_4F_8+NF_3)$ mixing ratio is 57% or more, the ratio of fluorine (F):carbon (C) in the mixed gas is 3:1 or more and CFx radicals in the plasma mainly include carbon tetrafluoride ($CF_3$) and fluorine (F). Since $CF_3$ is not deposited over an SiGe surface, SiGe etching proceeds after the SiGeOx layers 506 are removed. When the $NF_3/(C_4F_8+NF_3)$ mixing ratio is 57% or less, the ratio of F:C in the mixed gas is 3:1 or less and there are particles that tend to be deposited such as carbon difluoride ($CF_2$) in the CFx radicals in the plasma. Etch stop occurs by the surface deposition of $CF_2$ after the SiGeOx layers 506 are removed. FIG. 11 shows dependence of etching speeds of SiGe and Si on an $NF_3/(C_4F_3+NF_3)$ gas mixing ratio. When the $NF_3/(C_4F_3+NF_3)$ mixing ratio is 57% or less, stop of etching occurs.

Incidentally, at Step 603b, CFx radicals may be generated by not only a mixed gas of $C_4F_8$ and $NF_3$ but also a gas containing C and F. A mixed gas having an F:C ratio of 3:1 or less is desirable in order to stop etching after the SiGeOx layers 506 are removed. That is, as a gas containing fluorine elements and carbon elements used in the removal process (Step 603b), a gas having a ratio of fluorine elements to carbon elements of 3 or less may preferably be used.

As a mixed gas having an elemental ratio of fluorine (F) and carbon (C) of 3:1 or less, a mixed gas of a fluorine (F) element containing gas having an elemental ratio of fluorine (F) and carbon (C) of 3:1 or more such as a nitrogen trifluoride ($NF_3$) gas, a carbon tetrafluoride ($CF_4$) gas, a sulfur hexafluoride ($SF_6$) gas, or a fluorine ($F_2$) gas and a carbon (C) element containing gas having an elemental ratio of fluorine (F) and carbon (C) of 3:1 or less such as an octafluorocyclobutane ($C_4F_8$) gas, an octafluorocyclopentene ($C_6F_8$) gas, a trifluoromethane ($CHF_3$) gas, a monofluoromethane ($CH_3F$) gas, a difluoromethane ($CH_2F_2$) gas, or a methane ($CH_4$) gas can be used.

Incidentally, when plasma irradiation is used at Step 603a and radical irradiation is used at Step 603b, the plasma irradiation and the radical irradiation may also be applied in chambers of different plasma etching apparatus, respectively. The plasma etching apparatus 300 has an advantage in improving a throughput because plasma irradiation and radical irradiation can be applied in an identical chamber 301.

To summarize Example 1, the following can be said.

1) A plasma processing method of isotropically etching respective silicon germanium (SiGe) layers 503 selectively to respective silicon (Si) layers 502 in a laminated structure in which the silicon (Si) layers 502 and the silicon germanium (SiGe) layers 503 are stacked alternately:
has
an oxidation process (603a) of oxidizing the silicon germanium (SiGe) layers 503 and the silicon (Si) layers 502 by plasma using an oxygen element containing gas and
a removal process (603b) of removing the silicon germanium (SiGe) layers 503 by radicals generated by plasma using a gas containing fluorine elements and carbon elements; and
etches the silicon germanium (SiGe) layers 503 by repeating the oxidation process (603a) and the removal process (603b).

2) A gas having a ratio of the fluorine elements to the carbon elements of 3 or less is used as the gas containing fluorine elements and carbon elements.

3) The gas containing fluorine elements and carbon elements is a mixed gas of
"a nitrogen trifluoride ($NF_3$) gas, a carbon tetrafluoride ($CF_4$) gas, a sulfur hexafluoride ($SF_6$) gas, or a fluorine ($F_2$) gas" and
"an octafluorocyclobutane ($C_4F_8$) gas, an octafluorocyclopentene ($C_6F_8$) gas, a trifluoromethane ($CHF_3$) gas, a monofluoromethane ($CH_3F$) gas, a difluoromethane ($CH_2F_2$) gas, or a methane ($CH_4$) gas".

4) The above items 1) to 3) can be used for a manufacturing method of a semiconductor device that forms a Gate All Around-Field Effect Transistor (GAA-FET) by isotropically etching respective silicon germanium (SiGe) layers 503 selectively to respective silicon (Si) layers 502 in a laminated structure in which the silicon (Si) layers 502 and the silicon germanium (SiGe) layers 503 are stacked alternately.

Example 2

When a mask 501 includes $SiO_2$, the mask 501 may possibly be removed as well as the SiOx layers 505 at Step 604 in the case of Example 1. To cope with this problem, in Example 2, not oxidation but surface nitridation and removal of surface nitride layers of an Si/SiGe laminated structure are applied repeatedly in the structure in which the mask 501 includes $SiO_2$. A plasma processing method in an SiGe selective etching means of Example 2 is shown as a flowchart in FIG. 12.

An Si/SiGe laminated structure processed in Example 2 is similar to Example 1. Steps 1201 and 1202 in Example 2 are similar to Steps 601 and 602 in Example 1.

Figure 12:
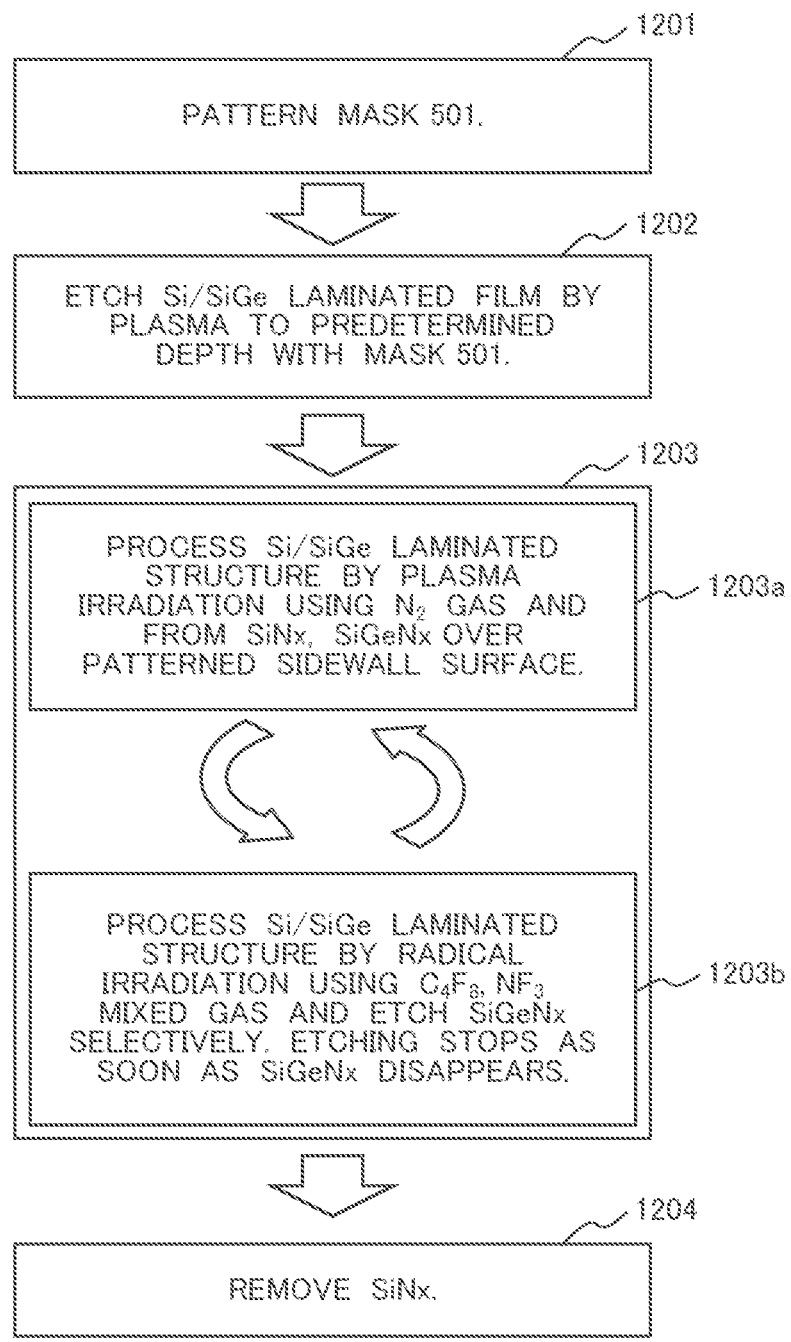
FIG. 12 is a flowchart of an SiGe isotropic etching method in Example 2.

The point of Example 2 different from Example 1 is that, at Step 1203 in FIG. 12, Step 1203a that is a nitridation process of nitriding (nitriding by plasma) Si layer surfaces and SiGe layer surfaces over the sidewall surfaces of an Si/SiGe laminated structure and forming surface nitrides (SiNx, SiGeNx) by plasma irradiation using a nitrogen element containing gas such as a nitrogen ($N_2$) gas and Step 1203b that is a removal process of removing the surface nitride SiGeNx formed over the surfaces of the SiGe layers by radical irradiation using a mixed gas of a fluorine element containing gas and a carbon element containing gas such as a mixed gas of an octafluorocyclobutane ($C_4F_8$) gas and a nitrogen trifluoride ($NF_3$) gas are applied repeatedly. The thicknesses of the nitride films (SiNx, SiGeNx) formed at Step 1203a are saturated with the increase of irradiation time similarly to an oxide film formed at Step 603a. At Step 1203b, CFx radicals are deposited over the SiGe surfaces after the surface nitride film (SiGeNx) formed over the surfaces of the SiGe layers 503 is removed similarly to Step 603b. The etching stops by the deposition of the CFx radicals.

At Step 1204, the target to be removed is not an oxide film but a surface nitride film (SiNx) formed over the surfaces of the Si layers 502. It is possible to prevent the loss (disappearance) of the mask 501 including $SiO_2$ by using a selective etching process of a nitride film (SiNx).

Incidentally, at Step 1203a, plasma irradiation is desirable from the viewpoint of improving a throughput but radical irradiation may be used.

Further, at Step 1203a, it would be good if Si and SiGe can be nitrided by not only $N_2$ but also a gas containing N elements.

Further, at Step 1203b, radical irradiation is desirable from the viewpoint of improving an SiGe/Si selectivity but plasma irradiation may be used.

Further, at Step 1203b, it would be good if CFx radicals can be generated by not only a mixed gas of $C_4F_8$ and $NF_3$ but also a gas containing C and F. A mixed gas having an F:C ratio of 3:1 or less is desirable in order to stop the etching of SiGe layers 503 after the nitride layer is removed. That is, as a gas containing fluorine elements and carbon elements used in the removal process (Step 1203b), a gas having a ratio of fluorine elements to carbon elements of 3 or less is desirably used.

As a mixed gas having an elemental ratio of fluorine (F) and carbon (C) of 3:1 or less, a mixed gas of a fluorine (F) element containing gas having an elemental ratio of fluorine (F) and carbon (C) of 3:1 or more such as a nitrogen trifluoride ($NF_3$) gas, a carbon tetrafluoride ($CF_4$) gas, a sulfur hexafluoride ($SF_6$) gas, or a fluorine ($F_2$) gas and a carbon (C) element containing gas having an elemental ratio of fluorine (F) and carbon (C) of 3:1 or less such as an octafluorocyclobutane ($C_4F_8$) gas, an octafluorocyclopentene ($C_6F_8$) gas, a trifluoromethane ($CHF_3$) gas, a monofluoromethane ($CH_3F$) gas, a difluoromethane ($CH_2F_2$) gas, or a methane ($CH_4$) gas can be used.

Incidentally, when plasma irradiation is used at Step 1203a and radical irradiation is used at Step 1203b, the plasma irradiation and the radical irradiation may also be applied in chambers of different plasma etching apparatus, respectively. The plasma etching apparatus 300 has an advantage in improving a throughput because plasma irradiation and radical irradiation can be applied in an identical chamber 301.

To summarize Example 2, the following can be said.

1) A plasma processing method of isotropically etching respective silicon germanium (SiGe) layers 503 selectively to respective silicon (Si) layers 502 in a laminated structure in which the silicon (Si) layers 502 and the silicon germanium (SiGe) layers 503 are stacked alternately:

has a nitridation process (1203a) of nitriding the silicon germanium (SiGe) layers 503 and the silicon (Si) layers 502 by plasma using a nitrogen element containing gas and a removal process (1203b) of removing the silicon germanium (SiGe) layers 503 by radicals generated by plasma using a mixed gas containing fluorine elements and carbon elements; and etches the silicon germanium (SiGe) layers 503 by repeating the nitridation process (1203a) and the removal process (1203b).

2) A gas having a ratio of the fluorine elements to the carbon elements of 3 or less is used as the gas containing fluorine elements and carbon elements.

3) The gas containing fluorine elements and carbon elements is a mixed gas of

"a nitrogen trifluoride ($NF_3$) gas, a carbon tetrafluoride ($CF_4$) gas, a sulfur hexafluoride ($SF_6$) gas, or a fluorine ($F_2$) gas" and "an octafluorocyclobutane ($C_4F_8$) gas, an octafluorocyclopentene ($C_6F_8$) gas, a trifluoromethane ($CHF_3$) gas, a monofluoromethane ($CH_3F$) gas, a difluoromethane ($CH_2F_2$) gas, or a methane ($CH_4$) gas".

4) The above items 1) to 3) can be used for a manufacturing method of a semiconductor device that forms a Gate All Around-Field Effect Transistor (GAA-FET) by isotropically etching respective silicon germanium (SiGe) layers 503 selectively to respective silicon (Si) layers 502 in a laminated structure in which the silicon (Si) layers 502 and the silicon germanium (SiGe) layers 503 are stacked alternately.

Example 3

Figure 13A:
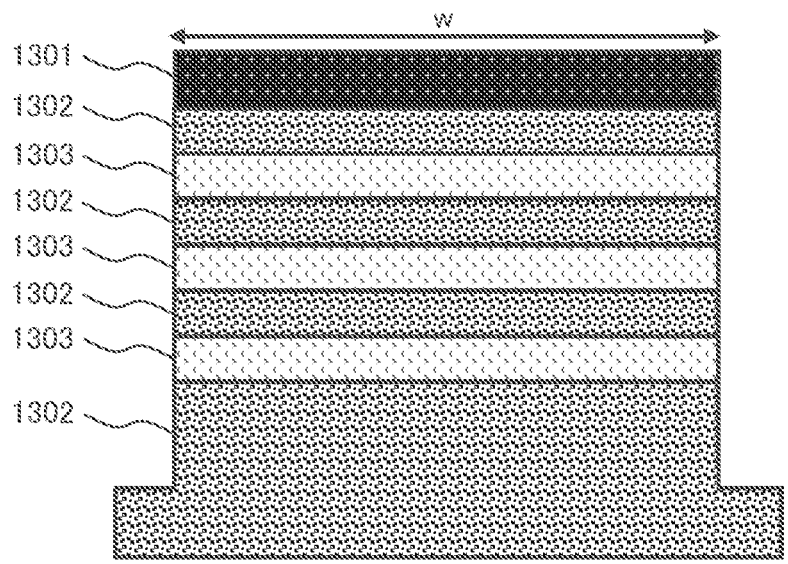
FIG. 13A is a cross-sectional view of an Si/SiGe laminated structure showing a process flow in Example 3.
Figure 13B:
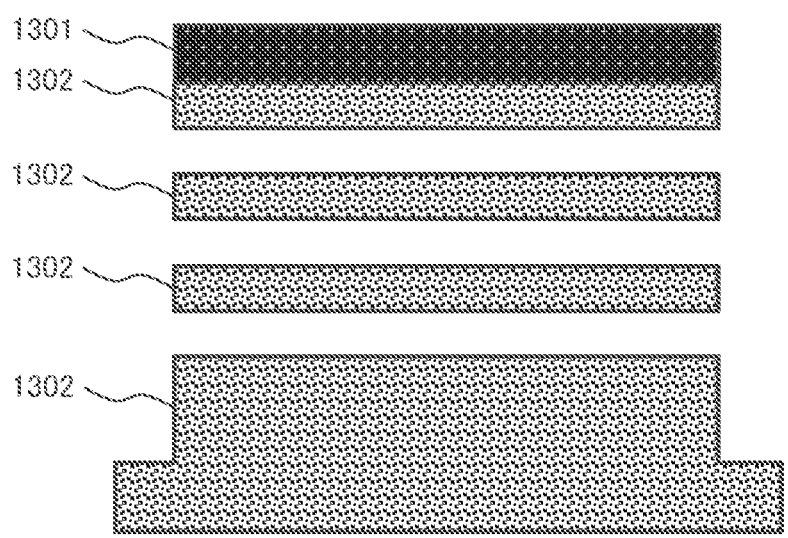
FIG. 13B is a cross-sectional view of an Si/SiGe laminated structure showing a process flow in Example 3.

At GAA-FET processing, besides the processes shown in FIGS. 5A to 5F, as shown in FIGS. 13A and 13B, a plasma processing method for a process of removing all of SiGe layers 1303 in an Si/SiGe laminated structure of Si layers 1302 and the SiGe layers 1303, those having a width of 40 nm or more, is required. In FIGS. 13A and 13B, 1301 is a mask layer and a material such as a silicon oxide film ($SiO_2$) or a silicon nitride film (SiN) that can obtain a high etching selectivity to Si and SiGe can be used, for example. At the process of removing all of the SiGe layers 1303, the etching amount of the SiGe layers 1303 is larger than the process shown in FIG. 5F and hence a high etching speed is required. In Example 3, as a means for high speed etching of the SiGe layers 1303, an oxidation step like Step 603a is not used and only plasma etching using a mixed gas of an octafluorocyclobutane ($C_4F_8$) gas and a nitrogen trifluoride ($NF_3$) gas is applied. An SiGe selective etching means in Example 3 is shown in FIG. 14 as a flowchart.

Steps 1401 and 1402 in Example 3 are similar to Steps 601 and 602 in Example 1.

Figure 14:
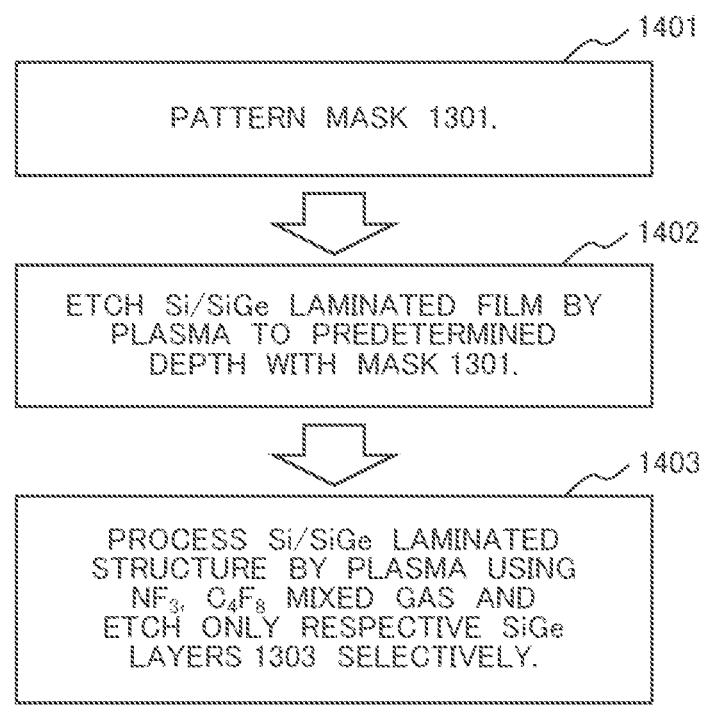
FIG. 14 is a flowchart of an SiGe isotropic etching method in Example 3.

The point of Example 3 different from Example 1 is that, at Step 1403 in FIG. 14, an oxidation step is not used and only plasma etching using a mixed gas of a $C_4F_8$ gas and an $NF_3$ gas is applied. As shown in the dependence of an etching speed on an $NF_3$ mixing ratio in FIG. 11, in order to prevent SiGe etching from stopping (etch stop), it is desirable to use a mixed gas having an $NF_3/(C_4F_9+NF_3)$ mixing ratio of 57 or more at Step 1403. That is, a proportion of a flow rate of the nitrogen trifluoride ($NF_3$) gas to a flow rate of the mixed gas is 57% or more. When an $NF_3/(C_4F_8+NF_3)$ mixing ratio is 57% or more, an F:C ratio in a mixed gas of $C_4F_8$ and $NF_3$ becomes 3:1 or more, the CFx radicals in the plasma mainly include carbon tetrafluoride ($CF_3$) that is hardly deposited, and hence etch stop caused by deposition of CFx radicals does not occur.

In Example 3, since a maximum SiGe etching speed of 100 nm/min can be obtained, there is an advantage in throughput if it is applied to a process of removing the whole SiGe shown in FIGS. 13A and 13B.

To summarize Example 3, the following can be said.

1) In a plasma processing method of etching silicon germanium (SiGe) layers 1303 by plasma selectively to silicon (Si) layers 1302, the silicon germanium (SiGe) layers 1303 are etched by plasma by using a mixed gas of an octafluorocyclobutane ($C_4F_8$) gas and a nitrogen trifluoride ($NF_3$) gas.

2) A proportion of a flow rate of the nitrogen trifluoride ($NF_3$) gas to a flow rate of the mixed gas is 57% or more.

3) The above items 1) and 2) can be used for a manufacturing method of a semiconductor device that forms a Gate All Around-Field Effect Transistor (GAA-FET) by isotropically etching respective silicon germanium (SiGe) layers 503 selectively to respective silicon (Si) layers 502 in a laminated structure in which the silicon (Si) layers 502 and the silicon germanium (SiGe) layers 503 are stacked alternately.

Although the invention made by the present inventors has heretofore been explained concretely on the basis of the examples, it goes without saying that the present invention is not limited to the above embodiments and examples and can be variously modified.

REFERENCE SIGNS LIST 101, 201, 501, 1301: mask
102, 202, 502, 1302: Si layer
103, 203, 503, 1303: SiGe layer
204, 508: etching amount of SiGe layer
300: plasma etching apparatus
301: vacuum chamber
302: substrate mounting table
310: perforated plate
312: dielectric window
313: decompression chamber lower area
314: decompression chamber upper area
320: magnetron
330: gas supply nozzle
340: control unit
400: gas supply unit
411, 421, 431: mass flow controller (MFC)
412, 422, 432: valve
504: oxygen plasma 505: SiOx layer
506: SiGeOx layer
507: CFx radical

The invention claimed is:

1. A plasma processing method of isotropically etching respective silicon germanium (SiGe) layers selectively to respective silicon (Si) layers in a laminated structure in which the silicon (Si) layers and the silicon germanium (SiGe) layers are stacked alternately, the method comprising:
   an oxidation process of oxidizing the silicon germanium (SiGe) layers and the silicon (Si) layers by plasma using an oxygen element containing gas to form a silicon germanium oxide (SiGeOx) layer on an interior sidewall and an exterior sidewall of the silicon germanium (SiGe) layers and a silicon oxide (SiOx) layer on the interior sidewall and an exterior sidewall of the silicon (Si) layers, wherein a thickness of the silicon germanium oxide (SiGeOx) layer formed on the interior sidewall and the exterior sidewall of the silicon germanium (SiGe) layers is the same for each of the silicon germanium (SiGe) layers; and
   a removal process of removing the silicon germanium (SiGe) layers by removing the silicon germanium oxide (SiGeOx) layers up to an etch stop in each of the silicon germanium (SiGe) layers by radicals generated by plasma using a gas containing fluorine elements and carbon elements; and
   the silicon germanium (SiGe) layers are etched by repeating the oxidation process and the removal process such that a same etching amount is provided for each of the etched silicon germanium (SiGe) layers regardless of a depth of any one of the etched silicon germanium (SiGe) layers with respect to a different depth of any other of the etched silicon germanium (SiGe) layers.

2. A plasma processing method according to claim 1, wherein a gas having a ratio of the fluorine elements to the carbon elements of 3 or less is used as the gas containing fluorine elements and carbon elements.

3. The plasma processing method according to claim 1, wherein the gas containing fluorine elements and carbon elements is a mixed gas of:
   a nitrogen trifluoride ($NF_3$) gas, a carbon tetrafluoride ($CF_4$) gas, a sulfur hexafluoride ($SF_6$) gas, or a fluorine ($F_2$) gas; and
   an octafluorocyclobutane ($C_4F_8$) gas, an octafluorocyclopentene ($C_6F_8$) gas, a trifluoromethane (CHF3) gas, a monofluoromethane (CH3F) gas, a difluoromethane ($CH_2F_2$) gas, or a methane ($CH_4$) gas.

4. A plasma processing method of isotropically etching respective silicon germanium (SiGe) layers selectively to respective silicon (Si) layers in a laminated structure in which the silicon (Si) layers and the silicon germanium (SiGe) layers are stacked alternately, the method comprising:
   a nitridation process of nitriding the silicon germanium (SiGe) layers and the silicon (Si) layers by plasma using a nitrogen element containing gas to form a silicon germanium nitride (SiGeNx) layer on an interior sidewall and an exterior sidewall of the silicon germanium (SiGe) layers and a silicon nitride (SiNx) layer on the interior sidewall and an exterior sidewall of the silicon (Si) layers, wherein a thickness of the silicon germanium nitride (SiNiNi) layer formed on the interior sidewall and the exterior sidewall of the silicon germanium (SiGe) layers is the same for each of the silicon germanium (SiGe) layers; and
   a removal process of removing the silicon germanium (SiGe) layers by removing the silicon germanium nitride (SiGeNi) layers up to an etch stop in each of the silicon germanium (SiGe) layers by radicals generated by plasma using a mixed gas containing fluorine elements and carbon elements; and
   the silicon germanium (SiGe) layers are etched by repeating the nitridation process and the removal process such that a same etching amount is provided for each of the etched silicon germanium (SiGe) layers regardless of a depth of any one of the etched silicon germanium (SiGe) layers with respect to a different depth of any other of the etched silicon germanium (SiGe) layers.

5. The plasma processing method according to claim 4, wherein a gas having a ratio of the fluorine elements to the carbon elements of 3 or less is used as the gas containing fluorine elements and carbon elements.

6. The plasma processing method according to claim 4, wherein the gas containing fluorine elements and carbon elements is a mixed gas of:
   a nitrogen trifluoride ($NF_3$) gas, a carbon tetrafluoride ($CF_4$) gas, a sulfur hexafluoride ($SF_6$) gas, or a fluorine ($F_2$) gas; and
   an octafluorocyclobutane ($C_4F_8$) gas, an octafluorocyclopentene ($C_6F_8$) gas, a trifluoromethane (CHF3) gas, a monofluoromethane (CH3F) gas, a difluoromethane ($CH_2F_2$) gas, or a methane ($CH_4$) gas.

7. A plasma processing method of etching a silicon germanium (SiGe) layer by plasma selectively to a silicon (Si) layer,
   wherein the silicon germanium (SiGe) layer is etched by plasma by using a mixed gas of an octafluorocyclobutane ($C_4F_8$) gas and a nitrogen trifluoride ($NF_3$) gas,
   wherein a proportion of a flow rate of the nitrogen trifluoride ($NF_3$) gas to a flow rate of the mixed gas is 57% or more.

8. A manufacturing method of a semiconductor device that forms a Gate All Around-Field Effect Transistor (GAA-FET) by isotropically etching respective silicon germanium (SiGe) layers selectively to respective silicon (Si) layers in a laminated structure in which the silicon (Si) layers and the silicon germanium (SiGe) layers are stacked alternately, the method comprising:
   an oxidation process of oxidizing the silicon germanium (SiGe) layers and the silicon (Si) layers by plasma using an oxygen element containing gas to form a silicon germanium oxide (SiGeOx) layer on an interior sidewall and an exterior sidewall of the silicon germanium (SiGe) layers and a silicon oxide (SiOx) layer on the interior sidewall and an exterior sidewall of the silicon (Si) layers, wherein a thickness of the silicon germanium oxide (SiGeOx) layer formed on the interior sidewall and the exterior sidewall of the silicon germanium (SiGe) layers is the same for each of the silicon germanium (SiGe) layers; and
   a removal process of removing the silicon germanium (SiGe) layers by removing the silicon germanium oxide (SiGeOx) layers up to an etch stop in each of the silicon germanium (SiGe) layers by radicals generated by plasma using a gas containing fluorine elements and carbon elements; and
   the silicon germanium (SiGe) layers are etched by repeating the oxidation process and the removal process such that a same etching amount is provided for each of the etched silicon germanium (SiGe) layers regardless of a depth of any one of the etched silicon germanium (SiGe) layers with respect to a different depth of any other of the etched silicon germanium (SiGe) layers.

9. A manufacturing method of a semiconductor device that forms a Gate All Around-Field Effect Transistor (GAA-FET) by isotropically etching respective silicon germanium (SiGe) layers selectively to respective silicon (Si) layers in a laminated structure in which the silicon (Si) layers and the silicon germanium (SiGe) layers are stacked alternately, the method comprising:
- a nitridation process of nitriding the silicon germanium (SiGe) layers and the silicon (Si) layers by plasma using a nitrogen element containing gas to form a silicon germanium nitride (SiGeNx) layer on an interior sidewall and an exterior sidewall of the silicon germanium (SiGe) layers and a silicon nitride (SiNx) layer on the interior sidewall and an exterior sidewall of the silicon (Si) layers, wherein a thickness of the silicon germanium nitride (SiNiNi) layer formed on the interior sidewall and the exterior sidewall of the silicon germanium (SiGe) layers is the same for each of the silicon germanium (SiGe) layers; and
- a removal process of removing the silicon germanium (SiGe) layers by removing the silicon germanium nitride (SiGeNi) layers up to an etch stop in each of the silicon germanium (SiGe) layers by radicals generated by plasma using a mixed gas containing fluorine elements and carbon elements; and
- the silicon germanium (SiGe) layers are etched by repeating the nitridation process and the removal process such that a same etching amount is provided for each of the etched silicon germanium (SiGe) layers regardless of a depth of any one of the etched silicon germanium (SiGe) layers with respect to a different depth of any other of the etched silicon germanium (SiGe) layers.

10. A manufacturing method of a semiconductor device that forms a Gate All Around-Field Effect Transistor (GAA-FET) by isotropically etching respective silicon germanium (SiGe) layers selectively to respective silicon (Si) layers in a laminated structure in which the silicon (Si) layers and the silicon germanium (SiGe) layers are stacked alternately,
- wherein the silicon germanium (SiGe) layers are etched by plasma by using a mixed gas of an octafluorocyclobutane ($C_4F_8$) gas and a nitrogen trifluoride ($NF_3$) gas,
- wherein a proportion of a flow rate of the nitrogen trifluoride ($NF_3$) gas to a flow rate of the mixed gas is 57% or more.

* * * * *